(12) United States Patent
Higashi et al.

(10) Patent No.: US 8,712,572 B2
(45) Date of Patent: Apr. 29, 2014

(54) ELECTRONIC COMPONENT MOUNTING MACHINE AND OPERATING INSTRUCTION METHOD FOR THE SAME

(75) Inventors: Noboru Higashi, Yamanashi (JP); Masahiro Kihara, Yamanashi (JP); Kazuo Okamoto, Yamanashi (JP); Hidehiko Watanabe, Yamanashi (JP); Kenichi Kaida, Osaka (JP); Hideki Sumi, Yamanashi (JP); Michiaki Mawatari, Yamanashi (JP)

(73) Assignee: Panasonic Corporation, Osaka (JP)

( * ) Notice: Subject to any disclaimer, the term of this patent is extended or adjusted under 35 U.S.C. 154(b) by 216 days.

(21) Appl. No.: 13/122,231

(22) PCT Filed: Oct. 1, 2009

(86) PCT No.: PCT/JP2009/005090
§ 371 (c)(1),
(2), (4) Date: Apr. 1, 2011

(87) PCT Pub. No.: WO2010/038473
PCT Pub. Date: Apr. 8, 2010

(65) Prior Publication Data
US 2011/0184548 A1 Jul. 28, 2011

(30) Foreign Application Priority Data
Oct. 3, 2008 (JP) ................................. 2008-258137

(51) Int. Cl.
*G06F 19/00* (2011.01)
*G06F 17/00* (2006.01)

(52) U.S. Cl.
USPC ............ 700/121; 700/174; 700/181; 716/100

(58) Field of Classification Search
USPC ........................... 700/121, 174, 181; 716/100
See application file for complete search history.

(56) References Cited

U.S. PATENT DOCUMENTS 3,944,369 A * 3/1976 Cuthbert et al. ............... 356/394
4,147,461 A * 4/1979 Maier .............................. 408/46
(Continued)

FOREIGN PATENT DOCUMENTS

CN 101267728 A 9/2008
JP 02-012505 A 1/1990
(Continued)

OTHER PUBLICATIONS

Baxter et al.,"New Approaches to Low Cost Electronic Circuit Packages" IEEE, 1983, pp. 10-17.*
(Continued)

*Primary Examiner* — Kavita Padmanabhan
*Assistant Examiner* — Thomas Stevens
(74) *Attorney, Agent, or Firm* — Pearne & Gordon LLP

(57) ABSTRACT

A challenge to be met by the invention is to provide an electronic component mounting machine that makes up an electronic component mounting line and that standardizes an operation input method, to thus enable lessening of work load on an operator during performance of operation input action, and an operation instruction method for use with the electronic component mounting machine. In electronic component mounting machines that make it possible for a single machine to perform a plurality of types of works by replacement of a work head to be built into a common platform according to a type of work, a production start button to a model change button are provided as common individual input parts in a basic operation command input part of a display panel of an operation unit regardless of a work type. Control processing and computation processing commensurate with an operation instruction entered by way of the individual input part are performed according to a work program and a computation processing program corresponding to the work head recognized by a plug-in function.

2 Claims, 10 Drawing Sheets

(56) References Cited

U.S. PATENT DOCUMENTS

| | | | |
|---|---|---|---|
| 4,236,306 A * | 12/1980 | Hug et al. | 29/827 |
| 4,542,438 A * | 9/1985 | Yamamoto | 361/771 |
| 4,587,396 A * | 5/1986 | Rubin | 219/121.78 |
| 4,773,815 A * | 9/1988 | Lemelson | 414/744.3 |
| 5,232,143 A * | 8/1993 | Buxton | 228/6.2 |
| 5,325,305 A * | 6/1994 | Rezaei | 700/114 |
| 5,463,459 A * | 10/1995 | Morioka et al. | 356/237.5 |
| 5,696,687 A * | 12/1997 | DeMotte et al. | 700/114 |
| 5,954,517 A * | 9/1999 | Hagenlocher | 434/365 |
| 5,963,314 A * | 10/1999 | Worster et al. | 356/237.2 |
| 5,995,916 A * | 11/1999 | Nixon et al. | 702/182 |
| 6,002,650 A * | 12/1999 | Kuribayashi et al. | 700/117 |
| 6,028,673 A * | 2/2000 | Nagasaki et al. | 356/608 |
| 6,647,308 B1 * | 11/2003 | Prejean | 700/117 |
| 6,765,667 B2 * | 7/2004 | Higashi et al. | 356/237.4 |
| 7,296,613 B2 * | 11/2007 | Anderson et al. | 164/452 |
| 7,909,666 B2 * | 3/2011 | Nakamura | 439/876 |
| 8,090,461 B2 * | 1/2012 | Ohiaeri et al. | 700/97 |
| 2002/0167801 A1 * | 11/2002 | Suhara et al. | 361/728 |
| 2003/0027363 A1 * | 2/2003 | Kodama | 438/14 |
| 2003/0135991 A1 | 7/2003 | Nagao et al. | |
| 2004/0140415 A1 * | 7/2004 | Watson | 248/560 |
| 2005/0190956 A1 * | 9/2005 | Fujii et al. | 382/141 |
| 2006/0085973 A1 | 4/2006 | Kodama et al. | |
| 2006/0241888 A1 * | 10/2006 | Takahama | 702/127 |
| 2011/0225811 A1 | 9/2011 | Kodama et al. | |

FOREIGN PATENT DOCUMENTS

| | | |
|---|---|---|
| JP | 2001-111300 A | 4/2001 |
| JP | 2003-338697 A | 11/2003 |
| JP | 2004-006510 A | 1/2004 |
| JP | 2004-006512 A | 1/2004 |
| JP | 2004-221518 A | 8/2004 |
| JP | 2004-281717 A | 10/2004 |

OTHER PUBLICATIONS

Asakawa et al., "Automation of Chamfering by an Industrial Robot; For the Case of Machined Hole on a Cylindircal Workpiece", IEEE, 1998, pp. 2452-2457.*

International Search Report for PCT/JP2009/005090 dated Oct. 27, 2009, 2 pages.

Chinese Office action dated Jul. 2, 2013 for application 200980139281.6, 19 pages.

* cited by examiner

ELECTRONIC COMPONENT MOUNTING MACHINE AND OPERATING INSTRUCTION METHOD FOR THE SAME

TECHNICAL FIELD

The present invention relates to an electronic component mounting machine used in an electronic component mounting line for mounting electronic components on a substrate, to thus manufacture a mounted board as well as to an operation instruction method for the electronic component mounting machine.

BACKGROUND ART

An electronic component mounting line for manufacturing a mounted board by mounting electronic components on a substrate is built by connecting a plurality of electronic component mounting machines, like an electronic component loader and an inspection machine, (see; e.g., Patent Document 1). In an example described in connection with Patent Document 1, a test inspection station that is an inspection machine is coupled to a downstream side of a plurality of component mounting stations that are electronic component loaders. The machines are respectively connected to a host computer.

RELATED ART DOCUMENT

Patent Document

Patent Document 1: JP-A-2-12505

SUMMARY OF THE INVENTION

Problem that the Invention is to Solve

In the configuration, data and programs are transmitted from the host computer to the respective machines in the electronic component mounting line. However, operation for starting, stopping, and performing maintenance of the machines must be performed on a per-machine basis. For this reason, each of the machines making up the electronic component mounting line is individually equipped with an operation input unit to which an operator makes an access to perform required operation input action. A principle commonly used for the operation input unit includes an input part, like an icon, set on a screen of a display panel, and the operator carries out required operation input action by performing operation on the screen.

However, when an operating instruction is input by way of each of the machines used in the related-art electronic component mounting line, including the related art example machines described in connection with Patent Document 1, operational problems, such as those described below, arise. Specifically, the electronic component mounting line is built from a plurality of types of machines including different working details, and therefore display panels used for making an operation input also differ from each other in terms of a configuration. Therefore, an operator who performs monitoring of the electronic component mounting line and maintenance of the same must perform operation input action on the display panels whose configurations differ according to the types of the machines. The operator is required to become familiar with operations of the respective types of machines.

In the electronic component mounting line, various types of inspection machine are recently built into the line in response to a request for enhancement of quality control. Since such an inspection machine has a nature differing from that of a working machine, like a component loader, the inspection machine is also different from the working machine in terms of an operation method. Thus, learning an operation method for the inspection machine puts a heavy load on an inexperienced operator. Thus, in relation to the electronic component mounting machines making up the related-art electronic component mounting line, an operation input method changes according to the types of the machines, which poses a difficulty in lessening the load put on the operator at the time of performing operation input action.

Accordingly, the present invention aims at providing an electronic component mounting machine that enables standardization of an operation input method for respective electronic component mounting machines making up an electronic component mounting line, thereby lessening a work load imposed on an operator during performance of operation input action, as well as providing an operation instruction method for the electronic component mounting machine.

Means for Solving the Problem

An electronic component mounting machine of the present invention is an electronic component mounting machine that is used in an electronic component mounting line for mounting an electronic component on a substrate, so as to produce a mounted board, and that is capable of performing a plurality of types of works by a single machine by replacement of a work head to be built into a common platform according to a type of work to be performed by the machine. The machine includes: a substrate conveyance mechanism that conveys the substrate through an interior of the machine and a head transfer mechanism which transfers the replaceably attached work head to perform the work, the substrate conveyance mechanism and the head transfer mechanism making up the platform, a storage section that stores a plurality of types of work programs by means of which a mechanism control part that controls the work head and a work operation mechanism including the head transfer mechanism and the substrate conveyance mechanism to so as to carry out working operations performs control processing commensurate with the plurality of types of working operations and a plurality of types of computation processing programs by means of which a computation processing part that performs computation processing required to perform the working operations performs computation processing commensurate with the plurality of types of working operations; an execution control part that controls the mechanism control part and the computation processing part, so as to let the mechanism control part and the computation processing part perform control processing and computation processing commensurate with the work type; an operation instruction input unit that has individual input parts for individually inputting an operation instruction of a machine operator to the execution control part according to instruction descriptions and that is at least commonly equipped with the individual input part, regardless of the work type, for an individual operation instruction including at least a work start/end instruction meaning start or end of working operation of the machine; and a work head recognition unit for recognizing a type of a work head attached to the head transfer mechanism. The execution control part determines a work program corresponding to the work head recognized by the work head recognition unit and a computation processing program, from among the plurality of types of stored work programs and computation processing programs, and lets the mechanism control part and the computation processing part perform control processing and computation processing commensurate with an operation instruction, which has been input by the individual input part, according to the determined work program and the determined computation processing program.

An operation instruction method for use with electronic component mounting machines of the present invention is an operation instruction method for use with an electronic component mounting machine that is used in an electronic component mounting line for mounting an electronic component on a substrate, so as to produce a mounted board, that is capable of performing a plurality of types of mounting operations by a single machine by replacement of a work head to be built into a common platform according to a type of mounting operation to be performed by the machine, and that issue operation instructions for letting the electronic component mounting machine perform working operation and computation processing. The electronic component mounting machine includes: a substrate conveyance mechanism that conveys the substrate through an interior of the machine and a head transfer mechanism which transfers the replaceably attached work head to perform the work, the substrate conveyance mechanism and the head transfer mechanism making up the platform; a storage section that stores a plurality of types of work programs by means of which a mechanism control part that controls the work head and a work operation mechanism including the head transfer mechanism and the substrate conveyance mechanism to thereby carry out working operations performs control processing commensurate with the plurality of types of working operations and a plurality of types of computation processing programs by means of which a computation processing part that performs computation processing required to perform the working operations performs computation processing commensurate with the plurality of types of working operations; an execution control part that controls the mechanism control part and the computation processing part, thereby letting the mechanism control part and the computation processing part perform control processing and computation processing commensurate with the work type; an operation instruction input unit that has individual input parts for individually inputting an operation instruction of a machine operator to the execution control part according to instruction descriptions and that is at least commonly equipped with the individual input part, regardless of the work type, for an individual operation instruction including at least a work start/end instruction meaning start or end of working operation of the machine; and a work head recognition unit for recognizing a type of a work head attached to the head transfer mechanism. There is determined a work program corresponding to the work head recognized by the work head recognition unit and a computation processing program, from among the plurality of types of stored work programs and computation processing programs, and the mechanism control part and the computation processing part are caused to perform control processing and computation processing commensurate with an operation instruction, which has been input by way of the individual input part, according to the determined work program and the determined computation processing program.

Advantage of the Invention

According to the present invention, in an electronic component mounting machine that is capable of performing a plurality of types of works for a single machine by replacement of a work head to be built into a common platform according to a type of work to be performed by the machine, an operation instruction input unit that issues an operation instruction to a mechanism control part for controlling a working operation mechanism and an execution control part for controlling a computation processing part which performs computation processing required to perform working operation is commonly provided, regardless of a type of work descriptions, with individual input parts for individually making an input according to instruction descriptions. A work program corresponding to the work head recognized by a work head recognition unit and a computation processing program are determined from among a plurality of types of stored programs, and the mechanism control part and the computation processing part are caused to perform control processing and computation processing commensurate with an operation instruction, which has been input by the individual input part, according to the work program determined by recognition and the determined computation processing program. The method for making an operation input to the respective machines is standardized, thereby lessening work load on an operator during performance of operation input action.

EMBODIMENT FOR IMPLEMENTING THE INVENTION

Figure 1:
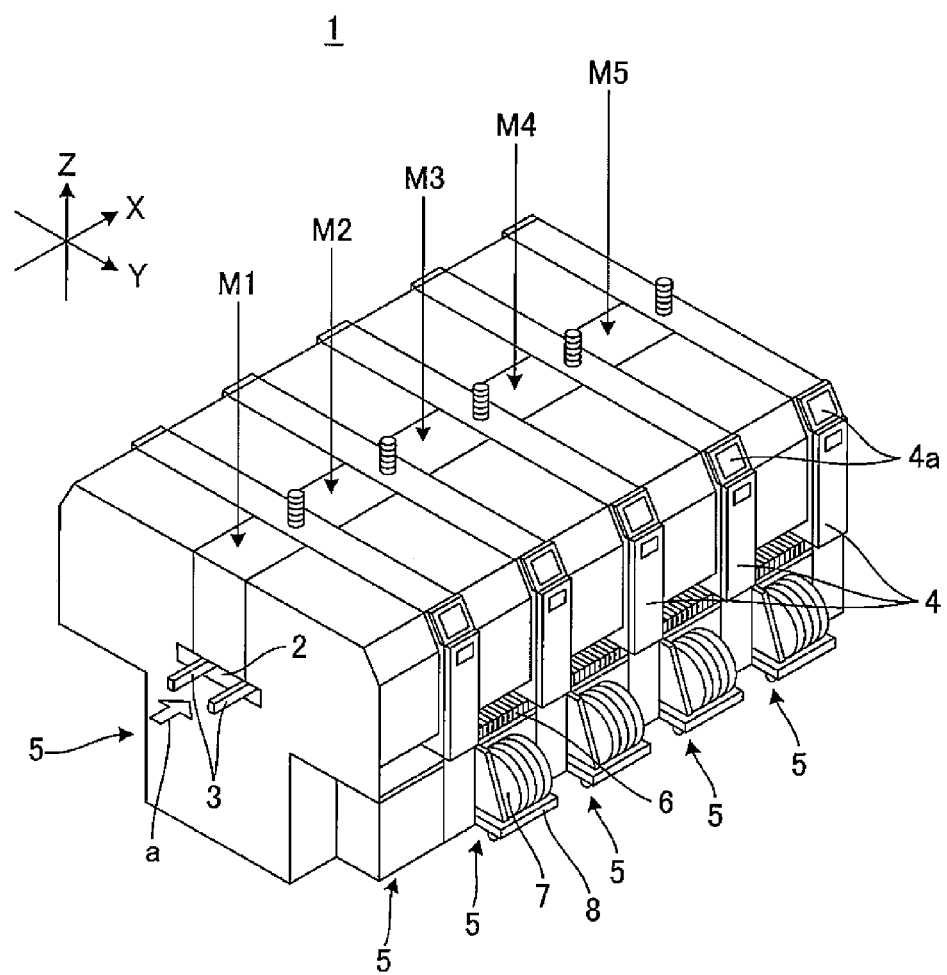
FIG. 1 is an oblique perspective view of an electronic component mounting system of an embodiment of the present invention.
Figure 2:
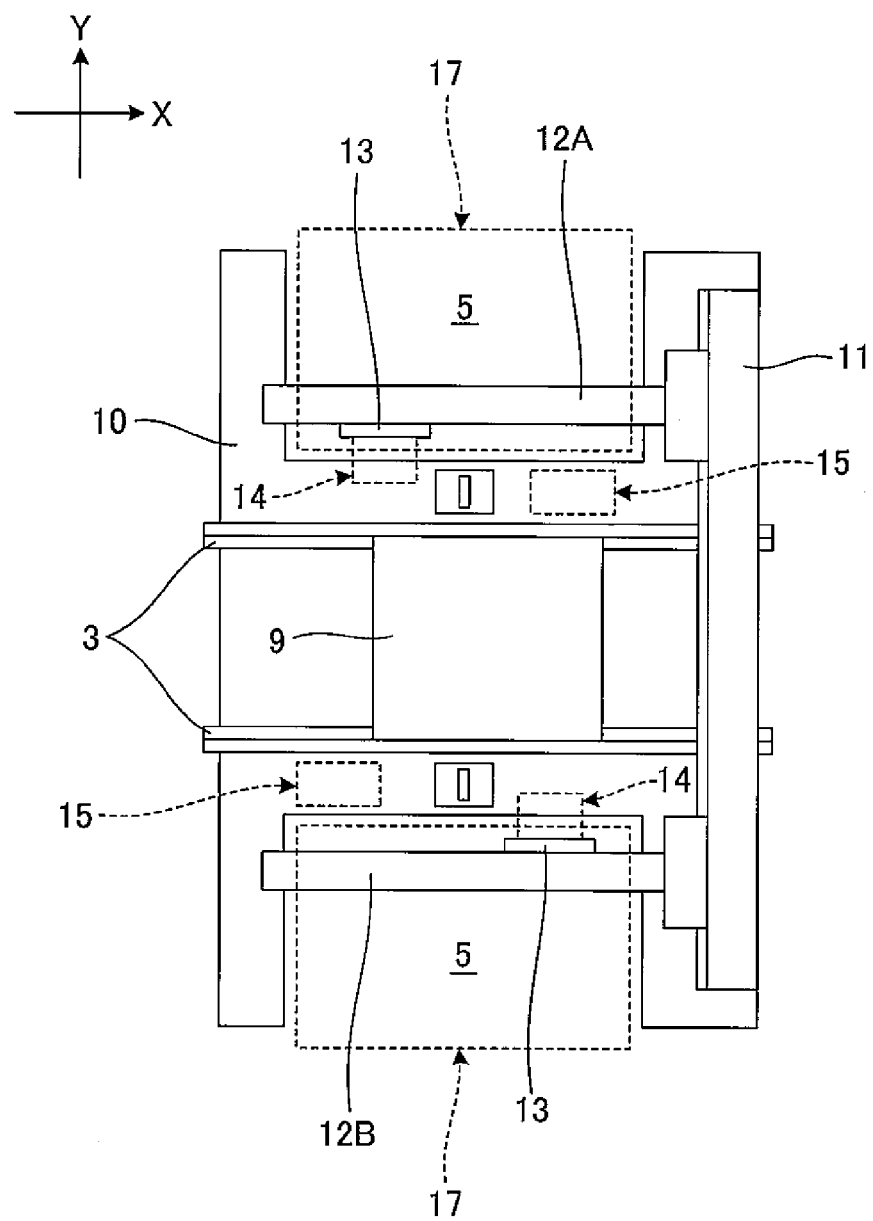
FIG. 2 is a plan view of a platform of an electronic component mounting machine of the embodiment of the present invention.
Figure 3:
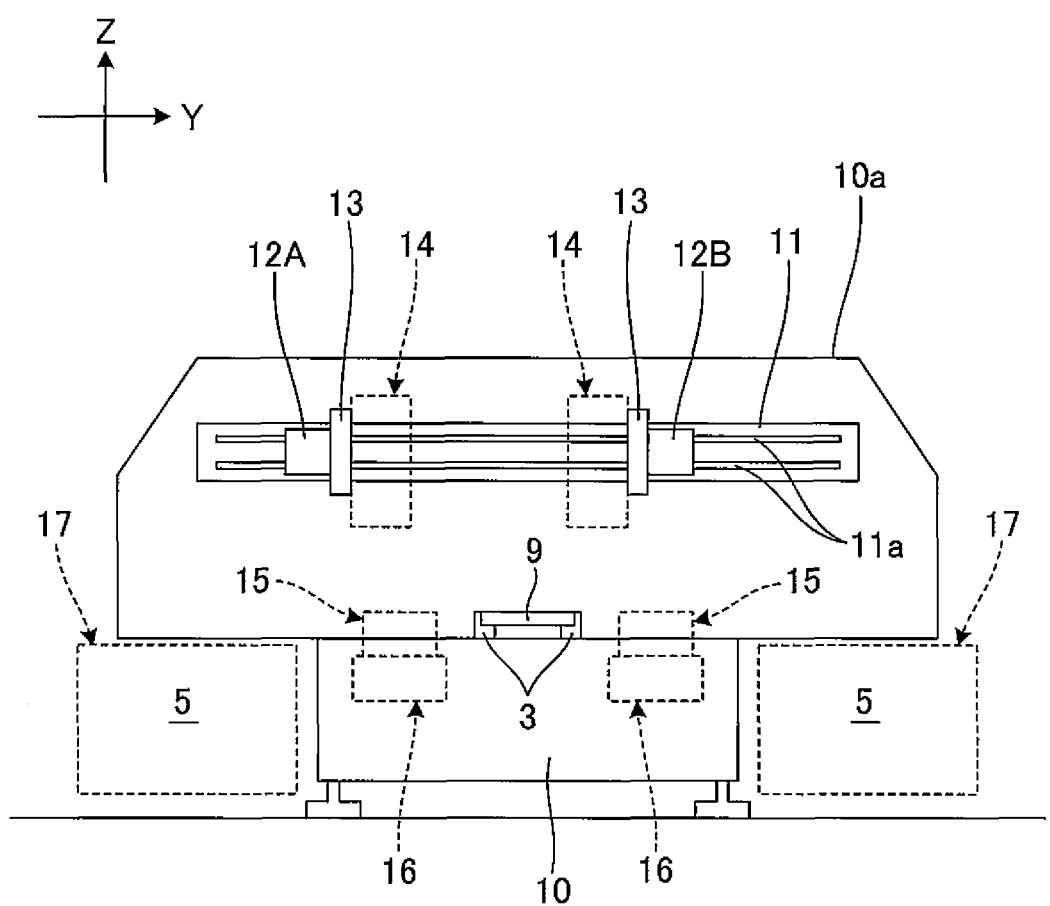
FIG. 3 is a cross sectional view of the plat form of the electronic component mounting machine of the embodiment of the present invention.
Figure 4:
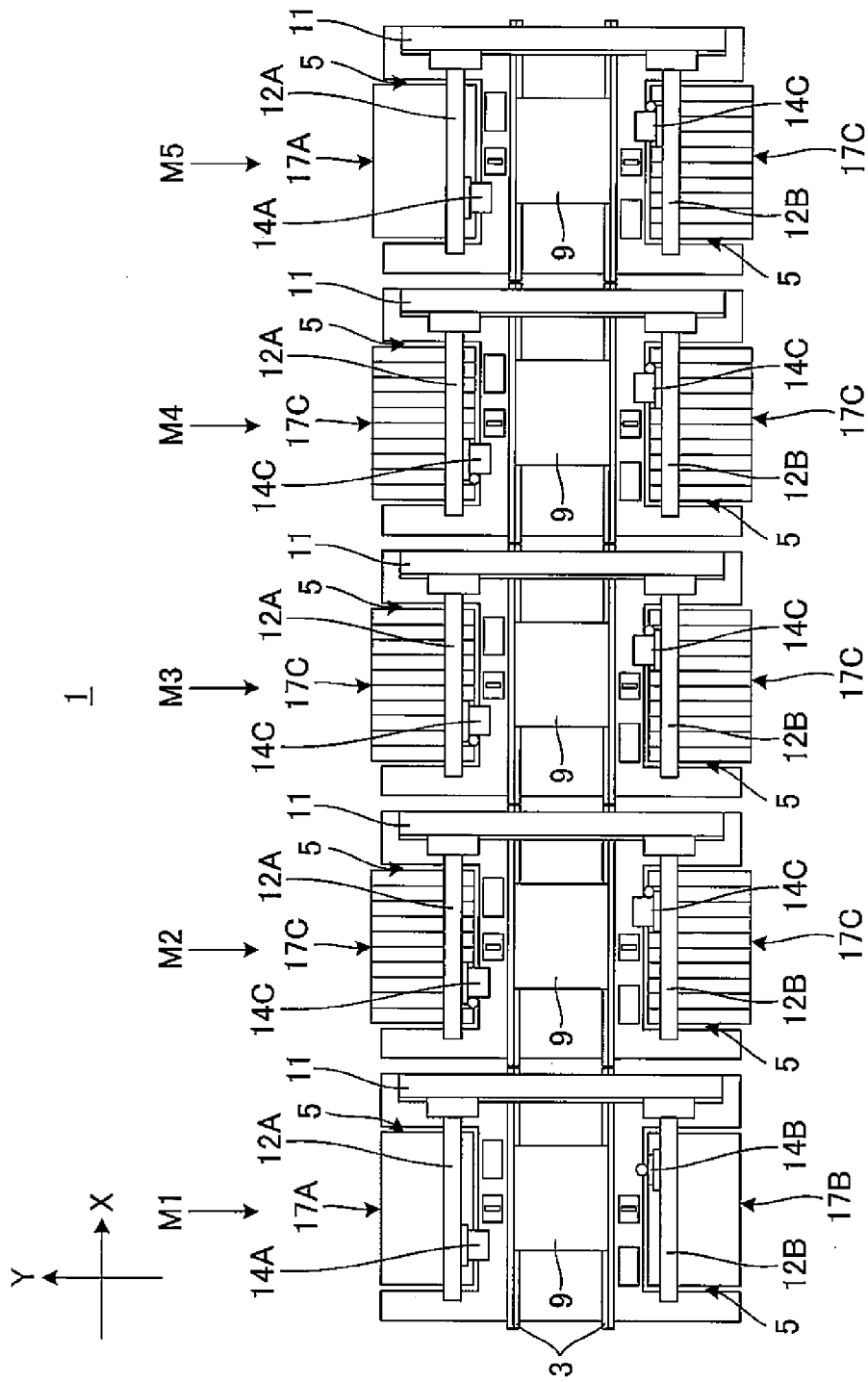
FIG. 4 is a plan view of the electronic component mounting system of the embodiment of the present invention.

An embodiment of the present invention is now described by reference to the drawings. FIG. 1 is an oblique perspective view of an electronic component mounting system of an embodiment of the present invention. FIG. 2 is a plan view of a platform of an electronic component mounting machine of the embodiment of the present invention. FIG. 3 is a cross sectional view of the plat form of the electronic component mounting machine of the embodiment of the present invention. FIG. 4 is a plan view of the electronic component mounting system of the embodiment of the present invention. FIGS.

Figure 7:
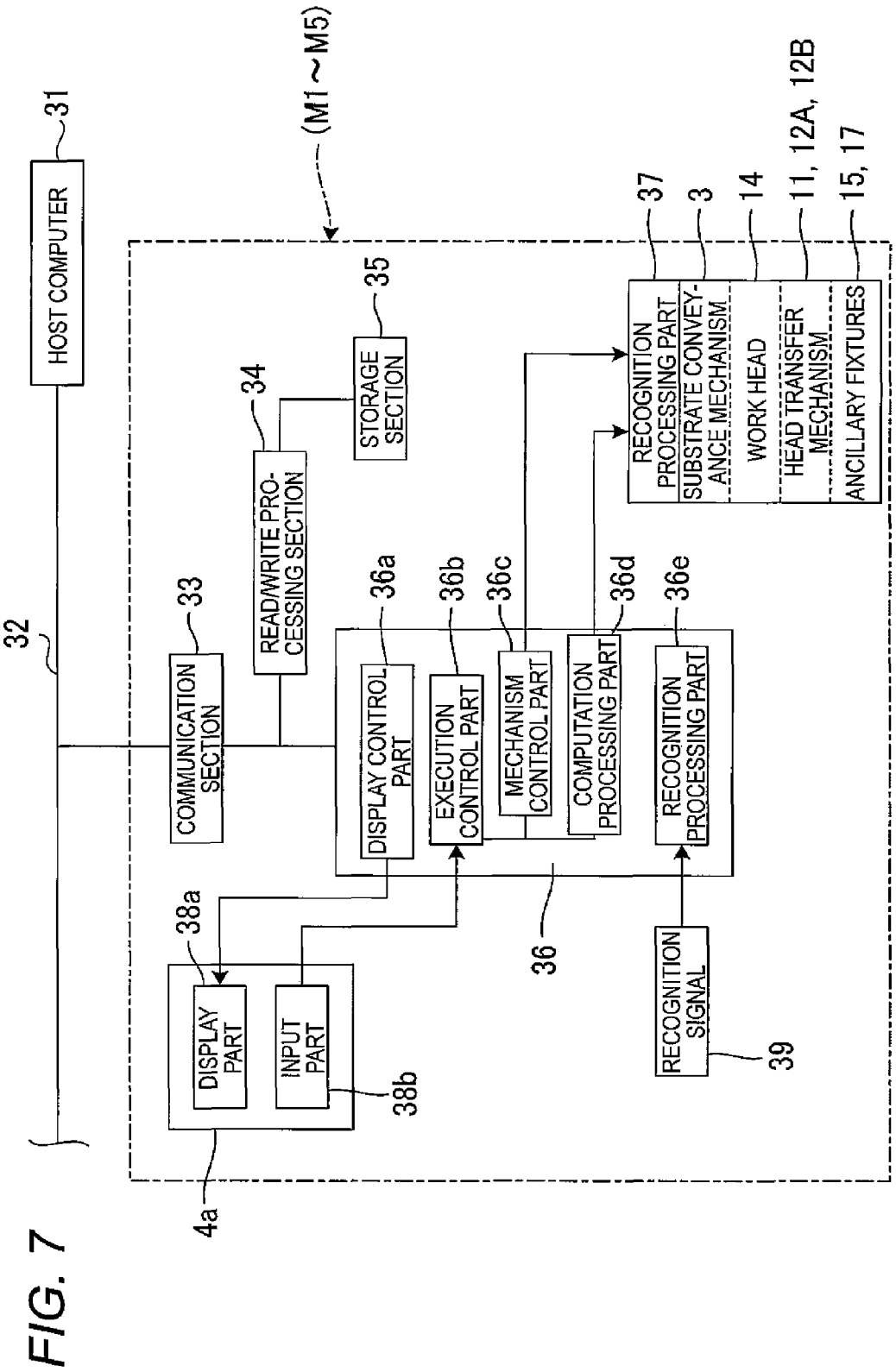
FIG. 7 is a section diagram showing a configuration of a control system of the electronic component mounting machine of the embodiment of the present invention.
Figure 8:
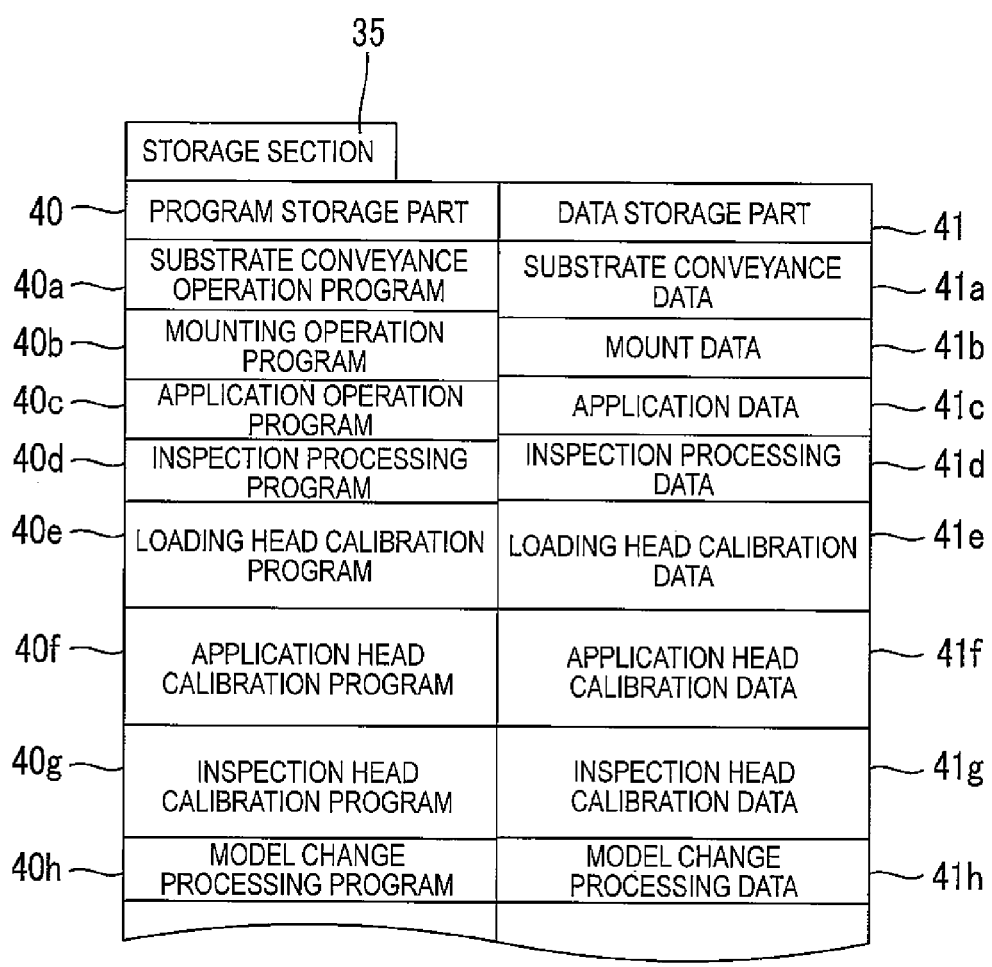
FIG. 8 is a descriptive view of a program and data stored in the electronic component mounting machine of the embodiment of the present invention.
Figure 9:
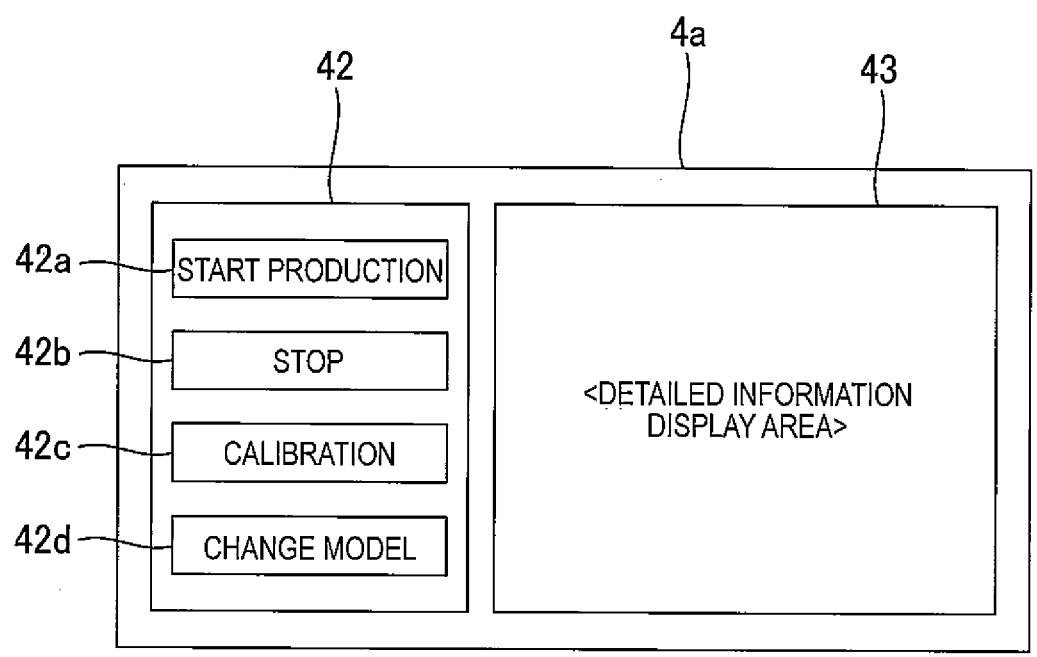
FIG. 9 is a descriptive view of an operation screen appearing on an operation unit of the electronic component mounting machine of the embodiment of the present invention.
Figure 10:
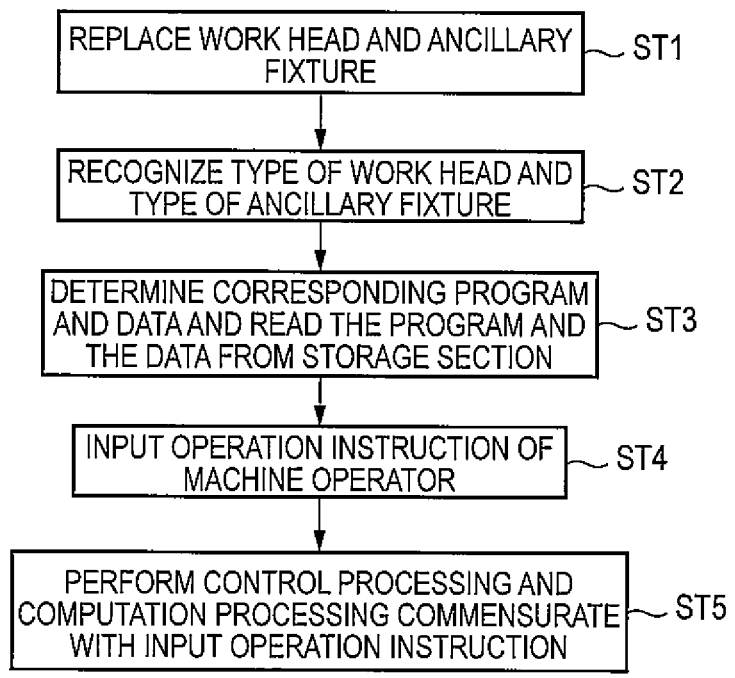
FIG. 10 is a flowchart showing an operation instruction method for use in the electronic component mounting machine of the embodiment of the present invention.

5 and 6 are descriptive views of a working head and an ancillary fixture used in the electronic component mounting machine of the embodiment of the present invention. FIG. 7 is a section diagram showing a configuration of a control system of the electronic component mounting machine of the embodiment of the present invention. FIG. 8 is a descriptive view of a program and data stored in the electronic component mounting machine of the embodiment of the present invention. FIG. 9 is a descriptive view of an operation screen appearing on an operation unit of the electronic component mounting machine of the embodiment of the present invention. FIG. 10 is a flowchart showing an operation instruction method for use in the electronic component mounting machine of the embodiment of the present invention.

First, a configuration of an electronic component mounting system 1 is described by reference to FIG. 1. The electronic component mounting system 1 is built by connecting in series a plurality of electronic component mounting machines (hereinafter abbreviated simply as "machines") M1, M2, M3, M4, and M5. The electronic component mounting system has a function of mounting electronic components on a substrate, thereby manufacturing a mounted board. In the electronic component mounting system 1, a substrate printed with solder bonding paste in an upstream machine is sent (as designated by arrow "a") to a substrate conveyance mechanism 3 by way of a conveyance inlet 2 in the machine M1 situated at the topmost upstream position. The substrate is sequentially conveyed through an interior of the electronic component mounting system 1 in direction X (a direction of conveyance of a substrate). The thus-carried-in substrate are subjected to operations of the respective machines and further conveyed to downstream machines.

An operation unit 4 by way of which a machine operator operates a corresponding machine is provided on each of sides of the machines M1 to M5. Each of the operation units 4 has a display panel 4a, and various screens, like an operation guidance screen, appear on the display panel 4a. The machine operator can input an operation instruction by touch panel switches set in the screen. A fixture storage compartment 5 for storing an ancillary fixture appropriate for work performed by the equipment is provided in a lower portion of the side surface of the machine (see FIGS. 3 and 4).

The machines M1 to M5 are configured in such a way that a single machine can perform a plurality of types of work by exchanging a work head to be built into a common platform according to a type of work to be performed by the machine. An ancillary fixture conforming to the work head of the machine is removably loaded into the corresponding fixture storage compartment 5. An exemplification provided herein shows that a carriage 8 including a plurality of tape feeders 6 and component feed reels 7 arranged side by side is loaded in each of the fixture storage compartments 5 of the machines M2 to M5. Each of the tape feeders 6 feeds electronic components held on a carrier tape to a loading head that is a work head for loading a component, and each of the component feed reels 7 holds in a wound state the carrier tape to be fed by the tape feeder 6.

A common platform that acts as a base for the machines M1 to M5 is now described by reference to FIGS. 2 and 3. In FIG. 3, the substrate conveyance mechanism 3 is disposed in the center of a bench 10 along the direction X. The substrate conveyance mechanism 3 conveys a substrate 9 carried in from an upstream position, placing the thus-conveyed substrate at a work position in the machine. The fixture storage compartment 5 is provided on either side of the bench 10 with the substrate conveyance mechanism 3 interposed therebetween, by partially cutting the bench 10 so as to make a deep recess toward the center of the bench. A first ancillary fixture 17, like the carriage 8 shown in FIG. 1, is removably loaded into each of the fixture storage compartments 5. A second ancillary fixture 15 is interposed between one fixture storage compartment 5 and a corresponding substrate conveyance mechanism 3. The second ancillary fixture 15 is used for work in association with a corresponding work head 14 and removably attached to a corresponding attachment section 16 defined in the bench 10 as shown in FIG. 3.

A Y-axis actuation table 11 is placed at one end of the bench 10 along its direction Y. Two tables; namely, an X-axis actuation table 12A and an X-axis actuation table 12B, are attached to the Y-axis actuation table 11. As shown in FIG. 3, the X-axis actuation tables 12A and 12B are slidable in the direction Y along guide rails 11a disposed on a side surface of the Y-axis actuation table 11. The X-axis actuation tables 12A and 12B are actuated in the direction Y by a linear motor mechanism incorporated in the Y-axis actuation table 11. An X-axis movable attachment base 13 is attached to the X-axis actuation table 12A so as to be slidable in the direction X, and another X-axis movable attachment base 13 is attached to the X-axis actuation table 12B so as to be slidable in the direction X. The X-axis movable attachment bases 13 are actuated in the direction X by linear motor mechanisms incorporated in the respective X-axis actuation tables 12A and 12B.

The work heads 14 commensurate with the type of work to be performed by the machine are removably attached to the respective X-axis movable attachment bases 13. Therefore, the Y-axis actuation table 11 and the X-axis actuation tables 12A and 12B act as a head transfer mechanism for transferring the replaceably attached work heads 14 to perform the work. The head transfer mechanism built in the bench 10 and the substrate conveyance mechanism 3 that conveys the substrate 9 within the machine make up a common platform that is to serve as a base for the machines M1 to M5. A working operation mechanism built by attaching to the platform the work heads 14, the first ancillary fixtures 17, and the second ancillary fixtures 15 is enclosed by a machine cover 10a.

An example individual configuration of each of the machines in the electronic component mounting system 1 is now described by reference to FIG. 4. The machine M1 has a function of applying a resin adhesive to the substrate 9 printed with solder bonding paste in an upstream machine and inspecting the substrate before and after application of the resin adhesive. Specifically, an inspection head 14A is attached to the X-axis actuation table 12A of the machine M1, and an application head 14B is attached to the X-axis actuation table 12B of the same. A first ancillary inspection fixture 17A is attached to the fixture storage compartment 5 assigned to the X-axis actuation table 12A. A first ancillary application fixture 17B is attached to the fixture storage compartment 5 assigned to the X-axis actuation table 12B.

The machines M2, M3, and M4 each have the same configuration and a function of loading electronic components on the substrate 9 that is coated with a resin adhesive and that has finished undergoing inspection. Specifically, each of the X-axis actuation tables 12A and 12B in each of the machines is equipped with a loading head 14C. A first loading ancillary fixture 17C is stored in each of the fixture storage compartments 5 of the respective machines M2, M3, and M4. The loading head 14C picks up an electronic component from the corresponding first loading ancillary fixture 17C, thereby transferring and loading the thus-picked up electronic component to and on the substrate 9 positioned by the substrate conveyance mechanism 3.

In addition, the machine M5 has in combination a function of loading an electronic component on the substrate 9 and a function of inspecting the thus-loaded electronic component. Specifically, the X-axis actuation table 12A of the machine M5 is equipped with the inspection head 14A, and the X-axis actuation table 12B of the machine M5 is equipped with the loading head 14C. The first ancillary inspection fixture 17A is stored in the fixture storage compartment 5 assigned to the X-axis actuation table 12A, and the first loading ancillary fixture 17C is stored in the fixture storage compartment 5 assigned to the X-axis actuation table 12B.

Figure 5:
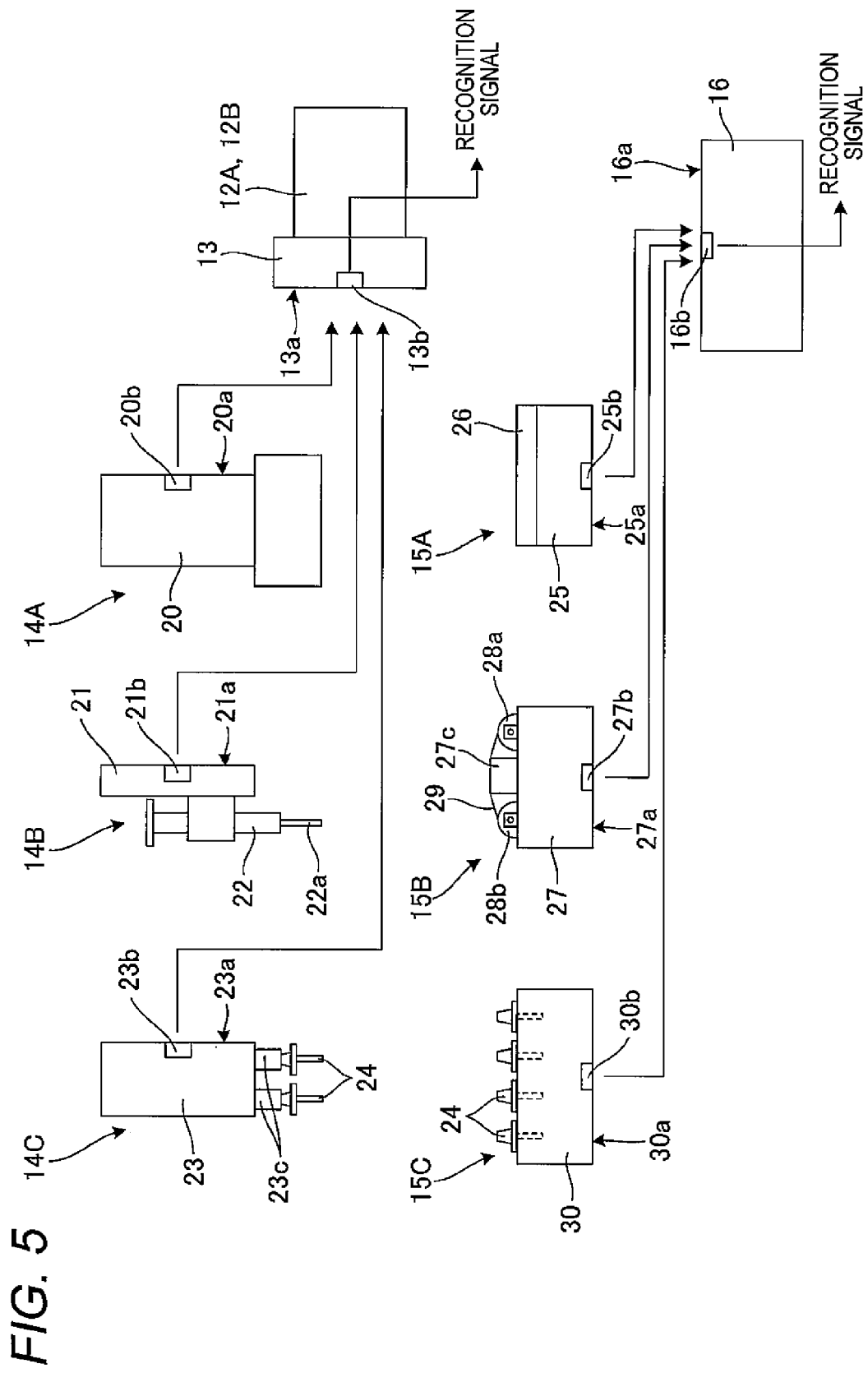
FIG. 5 is a descriptive view of a working head and an ancillary fixture used in the electronic component mounting machine of the embodiment of the present invention.
Figure 6:
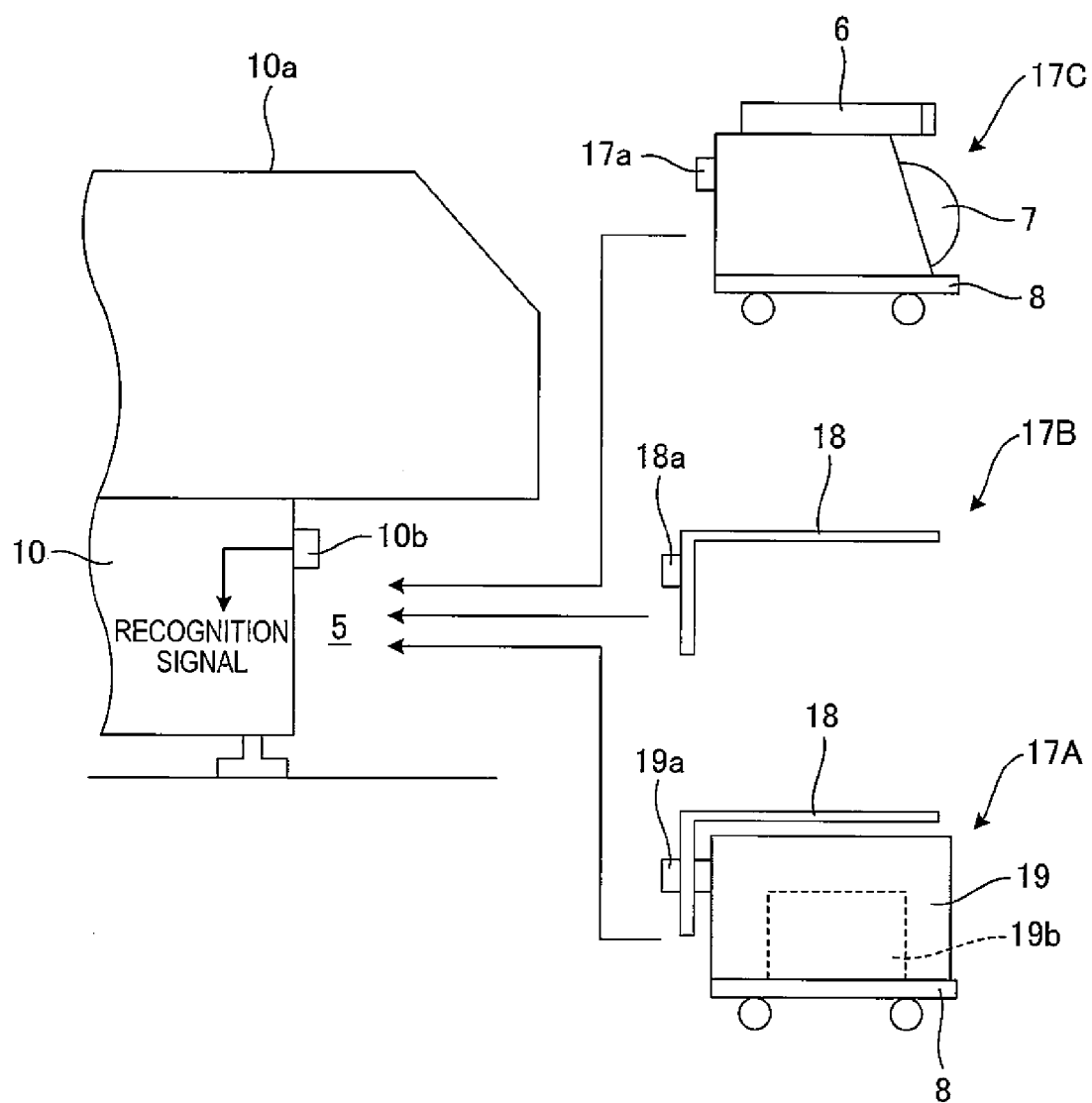
FIG. 6 is a descriptive view of the working head and an ancillary fixture used in the electronic component mounting machine of the embodiment of the present invention.

By reference to FIGS. 5 and 6, an explanation is now given to the work head 14 (the inspection head 14A, the application head 14B, and the loading head 14C), the second ancillary fixture 15 (a calibration unit 15A, a sacrificial squirt unit 15B, and a nozzle storage unit 15C), and the first ancillary fixture 17 (the first ancillary inspection fixture 17A, the first ancillary application fixture 17B, and the first loading ancillary fixture 17C) in terms of a configuration and an attachment form. As shown in FIG. 5, an imaging unit 20 for capturing an image of the substrate 9 to be inspected predominates in the inspection head 14A. As a result of being attached to the X-axis movable attachment base 13, the inspection head 14A is moved by the head transfer mechanism, to thus capture an image of the substrate 9 to be inspected.

The application head 14B is configured in such a way that a dispenser 22 is held by a vertical base 21 in a vertically movable manner. The dispenser 22 has a function of squirting a resin adhesive for bonding an electronic component from a nozzle 22a attached to a lower portion of the dispenser. The application head 14B is attached to the X-axis movable attachment base 13 and then moved to an elevated position above the substrate 9 by the head transfer mechanism, whereby it becomes possible to apply a resin adhesive to arbitrary points of resin application on the substrate 9. The loading head 14C has a configuration in which a suction nozzle 24 is removably attached to each of a plurality of nozzle attachment units 23c projecting from a lower portion of a head body 23. The loading head 14C is attached to the X-axis movable attachment base 13, thereby being moved by the head transfer mechanism. The suction nozzles 24 adsorb and hold electronic components to thereby pull the electronic components out of corresponding tape feeders 6, thereby transferring and loading the thus-pulled electronic components to and on a substrate.

In the inspection head 14A, an attachment surface 20a is provided on the imaging unit 20. In the application head 14B, an attachment surface 21a is provided on the vertical base 21. In the loading head 14C, an attachment surface 23a is provided on the head body 23. The attachment surfaces 20a, 21a, and 23a are brought into contact with an attachment base surface 13a provided on the X-axis movable attachment base 13, whereupon the inspection head 14A, the application head 14B, and the loading head 14C are respectively attached to the X-axis movable attachment base 13. A head sensor 20b is provided on the imaging unit 20; a head sensor 21b is provided on the vertical base 21; and a head sensor 23b is provided on the head body 23. With the inspection head 14A, the application head 14B, and the loading head 14C attached to the X-axis movable attachment base 13, an attachment detection sensor 13b provided on the X-axis movable attachment base 13 detects the head sensors 20b, 21b, and 23b. A recognition processing part 36e (see FIG. 7) to be described later detects, as a recognition signal, a detection signal output from the attachment detection sensor 13b, whereby a type of the work head 14 attached to the X-axis movable attachment base 13 is recognized.

An explanation is now given to the second ancillary fixtures 15 that are selectively attached to the corresponding attachment section 16 according to a type of the work head 14. The calibration unit 15A is used in combination with the inspection head 14A and configured by placing a calibration plate 26 on a bench 25. The inspection head 14A is transferred to a position over the calibration unit 15A to thereby capture an image of the corresponding attachment section 16. An image captured status achieved when the imaging unit 20 has acquired an image is thereby calibrated. The sacrificial squirt unit 15B is used in combination with the application head 14B and supplies a sacrificial squirt sheet 29 to a resin adhesive sacrificial squirt stage 27c laid on an upper surface of a bench 27. The sacrificial squirt sheet 29 is fed to a position on the sacrificial squirt stage 27c by a feed reel 28a, and the sheet is then taken up by a take-up reel 28b. The application head 14B is moved to a position above the sacrificial squirt unit 15B, where the dispenser 22 is lowered with respect to the sacrificial squirt stage 27c. Trial squirt for checking a squirted state of a resin adhesive and a sacrificial squirt for eliminating an unwanted resin adhesive adhering to the nozzle 22a are carried out.

The nozzle storage unit 15C is used in combination with the loading head 14C and configured such that the plurality of suction nozzles 24 are held in an upper surface of a nozzle storage table 30. There is performed nozzle replacement operation involving transferring the loading head 14C to a position over the nozzle storage unit 15C and lowering the nozzle attachment units 23c with respect to the nozzle storage table 30. The suction nozzles 24 can thereby be replaced according to a type of a target electronic component.

In the calibration unit 15A, an attachment surface 25a is provided on the bench 25. In the sacrificial squirt unit 15B, an attachment surface 27a is provided on the bench 27. In the nozzle storage unit 15C, an attachment surface 30a is provided on the nozzle storage table 30. The attachment surfaces 25a, 27a, and 30a are brought into contact with an attachment base surface 16a of the attachment section 16, whereby the calibration unit 15A, the sacrificial squirt unit 15B, and the nozzle storage unit 15C are attached to the attachment section 16. A unit sensor 25b is provided in the bench 25; a unit sensor 27b is provided in the bench 27; and a unit sensor 30b is provided in the nozzle storage table 30. With the calibration unit 15A, the sacrificial squirt unit 15B, and the nozzle storage unit 15C attached to the attachment section 16, an attachment detection sensor 16b provided in the attachment section 16 detects the unit sensors 25b, 27b, and 30b. The recognition processing part 36e (see FIG. 7) to be described later detects as a recognition signal a detection signal from the attachment detection sensor 16b, thereby recognizing a type of the second ancillary fixture 15 attached to the attachment section 16.

By reference to FIG. 6, the first ancillary fixtures 17 attached to the respective fixture storage compartments 5 of each of the machines M1 to M5 are now described. According to the type of the work head 14, three types of the first ancillary fixtures 17; namely, the first ancillary inspection fixture 17A, the second ancillary application fixture 17B, and the first loading ancillary fixture 17C, are selectively stored in each of the fixture storage compartments 5. The first ancillary inspection fixture 17A is used in correspondence with the inspection head 14A and built by placing on the carriage 8 a recognition processing unit 19 and a cover unit 18 for covering an area located above the recognition processing unit 19. The recognition processing unit 19 has a built-in recognition processor 19b having a function of subjecting image data acquired by the inspection head 14A to recognition processing.

The first ancillary application fixture 17B does not have any special function commensurate with the application head 14B and is attached simply as a safety cover for covering an area located above the corresponding fixture storage compartment 5, to thus close the fixture storage compartment. The first loading ancillary fixture 17C is made by placing on the carriage 8 the plurality of tape feeders 6 and the component feed reels 7 side by side. The loading head 14C is horizontally transferred, to thus make an access to the first loading ancillary fixture 17C, whereby the suction nozzle 24 pulls an electronic component out of a corresponding tape feeder 6.

A fixture joint connector 17a is provided on the first loading ancillary fixture 17C. A fixture joint connector 18a is provided on the first ancillary application fixture 17B. A fixture joint connector 19a is provided on the first ancillary inspection fixture 17A. The first ancillary fixture 17A, the first ancillary application fixture 17B and the first loading ancillary fixture 17C are attached to each of the fixture storage compartments 5 of the respective machines M1 to M5. Thus, the fixture connectors 17a, 18a, and 19a are fitted and connected to a main unit connector 10b provided on the corresponding fixture storage compartment 5. The first ancillary inspection fixture 17A, the first ancillary application fixture 17B, and the first loading ancillary fixture 17C output plug-in signals corresponding to respective types of the fixtures to the recognition processing part 36e (see FIG. 7), where the types of the first ancillary fixtures 17 attached to the corresponding fixture storage compartment 5 are recognized.

A configuration of a control system is now described by reference to FIG. 7. The respective machines M1 to M5 are connected to a host computer 31 by way of an LAN system 32, and the respective machines M1 to M5 are collectively controlled by the host computer 31. The host computer 31 transmits various programs and data to the respective machines M1 to M5. A control system of each of the machines M1 to M5 includes a communication section 33, a read/write processing section 34, a storage section 35, and a control processing section 36.

The communication section 33 is connected to the LAN system 32 and exchanges a signal with the other machines and the host computer 31 by way of the LAN system 32. The read/write processing section 34 performs processing for writing the programs and data received by way of the communication section 33 into the storage section 35 and processing for reading the programs and data from the storage section 35. The control processing section 36 controls a working operation mechanism 37 of each of the machines according to the programs and data read from the storage section 35 and an operation instruction input by way of an input part 38b provided in the display panel 4a of the operation unit 4 (see FIG. 1). The working operation mechanism 37 is made up of the substrate conveyance mechanism 3, the work head 14, the head transfer mechanism including the Y-axis actuation table 11 and the X-axis actuation tables 12A and 12B, and the ancillary fixtures 15 and 17.

A detailed configuration and function of each of the sections is hereunder described. The control processing section 36 includes as internal processing functions a display control part 36a, an execution control part 36b, a mechanism control part 36c, a computation processing part 36d, and the recognition processing part 36e. The display control part 36a performs control processing for letting a display part 38a of the display panel 4a provided in the operation unit 4 display a display screen like an operation screen. According to an operation instruction input by way of the input part 38b set in the display panel 4a, the execution control part 36b controls the mechanism control part 36c and the computation processing part 36d. The mechanism control part 36c controls the working operation mechanism 37 including the work head, the head transfer mechanism, and the substrate conveyance mechanism, thereby letting the working operation mechanism perform working operation. The computation processing part 36d performs computation processing required to perform work. The execution control part 36b controls the mechanism control part 36c and the computation processing part 36d, thereby performing control processing and computation processing commensurate with the type of work to be performed by the corresponding machine.

As shown in FIG. 8, the storage section 35 includes a program storage part 40 and a data storage part 41. Each of the program storage part 40 and the data storage part 41 stores programs and data, such as those provided below. Programs stored in the program storage part 40 include a substrate conveyance operation program 40a, a mounting operation program 40b, an application operation program 40c, an inspection processing program 40d, a loading head calibration program 40e, an application head calibration program 40f, an inspection head calibration program 40g, and a model change processing program 40h.

The substrate conveyance operation program 40a is a working operation program for conveying the substrate 9 by the substrate conveyance mechanism 3 and positioning the substrate at a predetermined work position. The mounting operation program 40b is an operation program for conveying and loading an electronic component to and on the substrate 9 by the loading head 14C. The application operation program 40c is an operation program for applying a resin adhesive to the substrate 9 by the application head 14B. The inspection processing program 40d is a processing program for capturing an image of the substrate 9 by use of the inspection head 14A, thereby letting the recognition processing unit 19 perform recognition processing. Specifically, the substrate conveyance operation program 40a, the mounting operation program 40b, the application operation program 40c, and the inspection processing program 40d correspond to a plurality of types of work programs for letting the work head 14 and the working operation mechanism 37 including the head transfer mechanism and the substrate conveyance mechanism perform working operations commensurate with a plurality of types of works.

On the occasion of execution of any of the working operation programs, a reference is made to substrate conveyance data 41a, mount data 41b, application data 41c, and inspection processing data 41d stored in the data storage part 41. The substrate conveyance data 41a are data, like a substrate conveyance width and a conveyance speed employed when the substrate conveyance mechanism 3 conveys a substrate. The mount data 41b are data that corresponds to a combination of a component mount position for each substrate type with a type of component to be mounted. The application data 41c are data that corresponds to a combination of a resin application position for each substrate type with squirting conditions, such as an amount of squirt from the dispenser 22. The inspection processing data 41d are data, like an inspection position to be taken as an inspection target and a determination threshold value used for checking a failure or a non-failure during an inspection.

The loading head calibration program 40e, the application head calibration program 40f, and the inspection head calibration program 40g are programs for performing processing to let the loading head 14C, the application head 14B, and the inspection head 14A respectively, automatically detect errors in attachment positions which arise when the heads are newly attached and perform necessary calibration computation, thereby matching the thus-calibrated positions to control parameters used in operation control of mechanical coordinate systems unique to the respective machines and the drive mechanism like the head transfer mechanism. Specifically, the loading head calibration program 40e, the application head calibration program 40f, and the inspection head calibration program 40g are a plurality of types of computation processing programs for letting the computation processing part that performs computation processing necessary to perform working operation, such as calibration processing, perform computation processing commensurate with a plurality of types of working operations. On the occasion of performance of calibration computation, a reference is made to the loading head calibration data 41e, the application head calibration data 41f, and the inspection head calibration data 41g stored in the data storage part 41. The model change processing program 40h is a program for performing processing required when a type of a substrate loaded into the electronic component mounting system 1 is switched. On the occasion of execution of the model change processing program 40h, a reference is made to the model change processing data 41h stored in the data storage part 41.

The storage section 35 provided in each of the machines M1 to M5 stores a plurality of types of work programs by means of which the mechanism control part 36c that controls the work head 14 and the working operation mechanism including the head transfer mechanism and the substrate conveyance mechanism 3 to thereby carry out working operation performs control processing commensurate with the plurality of types of working operations; and a plurality of types of computation processing programs by means of which the computation processing part 36d that performs computation processing required to perform the working operations performs computation processing commensurate with the plurality of types of working operations.

The recognition processing part 36e recognizes a type of the work head 14 attached to the corresponding X-axis movable attachment base 13, a type of the second ancillary fixture 15 attached to the corresponding attachment section 16, and a type of the first ancillary fixture 17 attached to the corresponding fixture storage compartment 5 in accordance with a recognition signal 39; namely, detection signals from the detection sensor in the work head 14 and the detection sensor in the second ancillary fixture 15, and a plug-in signal transmitted as a result of fitting of a connector during attachment of the first ancillary fixture 17. The head sensor provided in the work head 14, the attachment detection sensor 13b that outputs a detection signal upon detection of the sensor, and the recognition processing part 36e serve as a work head recognition unit that recognizes a type of work head attached to the head transfer mechanism.

Likewise, the fixture connectors 17a, 18a, and 19a provided in each of the first ancillary fixtures 17, the main unit connector 10b that fits to the connectors, thereby outputting a plug-in signal, the unit sensors 25b, 27b, and 30b, provided in each of the second ancillary fixtures 15, and the attachment detection sensor 16b that detects the sensors, thereby outputting a detection signal act as an ancillary fixture recognition unit that recognizes a type of the first ancillary fixture 17 attached to the corresponding fixture storage compartment 5 and a type of the second ancillary fixture 15 attached to the corresponding attachment section 16.

When reading a program and data from the storage section 35 in order to control the mechanism control part 36c and the computation processing part 36d, the execution control part 36b makes a reference to a result of recognition of the recognition processing part 36e. Specifically, the execution control part 36b identifies a program and data commensurate with a type of the work head 14 attached to the X-axis movable attachment base 13, reading the thus-identified program and data from the storage section 35. In accordance with the program and the data, the execution control part 36b controls the mechanism control part 36c and the computation processing part 36d.

The configuration of the display panel 4a is now described by reference to FIG. 9. As shown in FIG. 9, a basic operation command input part 42 that assumes a touch panel form intended to be used by the machine operator to enter an operation instruction for the work of a machine and a detailed information display area 43 are set within the display panel 4a. An image of the basic operation command input part 42 and an image of the detailed information display area 43 are displayed by the display control part 36a controlling the display part 38a.

The basic operation command input part 42 is an operation instruction input unit by way of which the machine operator performs input operation in connection with basic operation items. The basic operation command input part 42 is equipped with operation buttons, such as a production start button 42a, a stop button 42b, a calibration button 42c, and a model change button 42d. By actuation of these operation buttons, the input part 38b performs processing for inputting operation specifics to the execution control part 36b.

By actuation of the production start button 42a, the machine starts production operation. Production operation is stopped or completed by actuation of the stop button 42b. By actuation of the calibration button 42c, calibration processing required after the work head 14 of the machine has been replaced with a different type of the work head is automatically performed. By actuation of the model change button 42d, processing required in association with alteration of a type of a substrate to be produced, such as data replacement processing, is automatically performed. These are example operation buttons set on the basic instruction command input part 42. An operation button assigned to an operation command other than those mentioned above can also be provided, as required. Detailed information for adding supplements to descriptions of the basic operation command input part 42 is displayed in the detailed information display area 43, as required.

In the configuration of the display panel 4a, operation buttons, such as the production start button 42a, the stop button 42b, the calibration button 42c, and the model change button 42d, act as individual input parts for letting the machine operator individually input an operation instruction to the execution control part 36b according to instruction descriptions. The configuration of the display panel employed herein includes at least a work start/end instruction meaning start or end of working operation of the machine. In the present embodiment, the display panel 4a in each of the machines M1 to M5 displays the basic operation command input part 42 having a display configuration, such as that shown in FIG. 9, regardless of the type of a work to be performed by the machine.

The basic operation command input part 42 displayed on the display panel 4a is commonly provided with, regardless of the type of work, individual input parts for individual operation instructions, like the production start button 42a to the model change button 42d. In the present embodiment, a touch panel; namely, the individual input parts fitted into the display panel 4a, is used. However, as a matter of course, an input type of the individual input part is not limited to the touch panel type. Various types of switches, such as a mechanical actuation switch and a digital switch, can be used.

By reference to FIG. 10, an explanation is now given to an operation instruction method for issuing an operation instruction for letting each of the machines M1 to M5 making up the electronic component mounting system 1 perform working operation and computation processing. First, when the configuration of the machines of the electronic component mounting system 1 is newly changed, the work head 14 and the ancillary fixtures 15 and 17 required in each of the machines M1 to M5 making up the electronic component mounting system 1 are replaced (ST1). Specifically, the machine operator performs operation for replacing the work head 14, the second ancillary fixtures 15, and the first ancillary fixtures 17 attached to the common platform with fixtures commensurate with types of works newly assigned to the respective machines.

Next, the work head 14 and the ancillary fixtures 15 and 17 are recognized (ST2). Specifically, the work head 14, the second ancillary fixtures 15, and the first ancillary fixtures 17 are newly attached to the X-axis movable attachment base 13, the attachment section 16, and the fixture storage compartment 5, whereby the recognition signal 39 is output to the control processing section 36 by a plug-in function. The identification processing part 36e recognizes types of work with which the newly attached work head 14, the newly attached second ancillary fixtures 15, and the newly attached first ancillary fixtures 17 are commensurate.

Work programs and computation processing programs assigned to the recognized work head 14, the recognized second ancillary fixtures 15, and the recognized first ancillary fixtures 17 and data corresponding to the programs are specified and read from the storage section 35 (ST3). These processing operations are performed by the execution control part 36b. In relation to the machines subjected to change operation, updating software commensurate with hardware that performs operation newly assigned to the machines is thereby completed.

The machine operator subsequently inputs an operation instruction (ST4). The machine operator here selects a required instruction input on the display panel 4a of the operation unit 4. For instance, when the machines immediately start work for production, the production start button 42a provided in the basic operation command input part 42 of the display panel 4a is actuated. When production is stopped, the stop button 42b is actuated. When the newly attached work head 14 is determined to be newly subjected to calibration processing, the calibration button 42c is actuated. Moreover, when a model of a mounted board to be produced needs to be changed in the course of production, the inspection processing program 40d is actuated.

By the actuation operations, an operation instruction including a different description is input to the execution control part 36b from the input part 38b. According to the work program and the computation processing program specified in (ST3), the execution control part 36b lets the mechanism control part 36c and the computation processing part 36d perform control processing and computation processing commensurate with details of the operation instruction (ST5). Individual parts of the machines making up the working operation mechanism 37 perform the working operation commensurate with the operation instruction input by the machine operator.

Specifically, under the operation instruction method, a work program and a computation processing program corresponding to a work head recognized by the work head recognition unit are determined from the plurality of types of stored work programs and computation processing programs. The execution control part 36b lets the mechanism control part 36c and the computation processing part 36d perform control processing and computation processing commensurate with an operation instruction input from the individual input part, like the production start button 42a, provided in the display panel 4a by the machine operator, according to the determined work program and the determined computation processing program.

During the input operation for the operation instruction, a layout of an individual input part, like the production start button 42a, of the display panel 4a is common regardless of types of work descriptions assigned to the respective machines M1 to M5. Even when any one of the machines M1 to M5 is taken as an operation target, the machine operator can perform input operation by use of a single operation screen at all times. In particular, even when an inspection machine that differs from a general working machine, like a component loader, in terms of an operation method is mixedly present in the electronic component mounting system 1, it becomes possible to use a standardized operation input method for all of the machines. Even when an inexperienced operator monitors the electronic component mounting system 1 made up of machines including a plurality of types of work descriptions and performs maintenance of the system, it becomes easy for the operator to become familiar with the operation method, so that work load imposed on the operator during performance of operation input action can be lessened.

The present invention has been described in detail by reference to the specific embodiment. However, it is manifest to those skilled in the art that the present invention be susceptible to various alterations or modifications without departing the spirit and scope of the present invention.

The present patent application is based on Japanese Patent Application (JP-A-2008-258137) filed on Oct. 3, 2008, the entire subject matter of which is incorporated herein by reference.

INDUSTRIAL APPLICABILITY

The electronic component mounting system and the operation instruction method for use with the electronic component mounting system of the present invention yield an effect of standardizing a method for operating and making an input to respective electronic component mounting machines making up an electronic component mounting line and enabling lessening of work load imposed on an operator during performance of operating input action. Thus, the system and the method are useful for an electronic component mounting system built by interlinking of a plurality of machines.

DESCRIPTIONS OF THE REFERENCE NUMERALS AND SYMBOLS

1 ELECTRONIC COMPONENT MOUNTING SYSTEM
3 SUBSTRATE CONVEYANCE MECHANISM
4 OPERATION UNIT
4a DISPLAY PANEL
5 FIXTURE STORAGE COMPARTMENT
9 SUBSTRATE
11 Y-AXIS ACTUATION TABLE
12A, 12B X-AXIS ACTUATION TABLE
13 X-AXIS MOVABLE ATTACHMENT BASE
14 WORK HEAD
15 SECOND ANCILLARY FIXTURE
16 ATTACHMENT SECTION
17 FIRST ANCILLARY FIXTURE
42 BASIC OPERATION COMMAND INPUT PART (OPERATION INSTRUCTION INPUT UNIT)
42a PRODUCTION START BUTTON (INDIVIDUAL INPUT PART)
42b STOP BUTTON (INDIVIDUAL INPUT PART)

The invention claimed is:

1. An electronic component mounting machine that is used in an electronic component mounting line for mounting an electronic component on a substrate so as to produce a mounted board and capable of performing a plurality of types of works by a single machine by replacing a work head to be built into a common platform based on a type of work to be performed by the machine, the electronic component mounting machine comprising:
   a substrate conveyance mechanism conveys the substrate through an interior of the electronic component mounting machine and a head transfer mechanism which transfers the replaceably attached work head to perform the work, the substrate conveyance mechanism and the head transfer mechanism making up the common platform;
   a storage section that stores a plurality of types of work programs by means of which a mechanism control part that controls the work head and a work operation mechanism including the head transfer mechanism and the substrate conveyance mechanism so as to carry out working operations performs control processing commensurate with a plurality of types of working operations, and a plurality of types of computation processing programs by means of which a computation processing part that performs computation processing required to carry out the working operations performs computation processing commensurate with the plurality of types of working operations;
   an execution control part that controls the mechanism control part and the computation processing part, so as to let the mechanism control part and the computation processing part perform the control processing and the computation processing commensurate with the work type;
   an operation instruction input unit that has individual input parts for individually inputting an individual operation instruction of a machine operator to the execution control part according to instruction descriptions, wherein the individual operation instruction common to the plurality of types of works is displayed with common display arrangement regardless of the work type on each of the individual input parts and the individual operation instruction includes at least a work start/end instruction meaning start or end of working operation of the electronic component mounting machine; and
   a work head recognition unit for recognizing a type of a work head attached to the head transfer mechanism;
   wherein the execution control part determines a work program corresponding to the work head recognized by the work head recognition unit and a computation processing program, from among a plurality of types of stored work programs and computation processing programs, and lets the mechanism control part and the computation processing part perform control processing and computation processing commensurate with an operation instruction, which has been input by the individual input part, according to a determined work program and the determined computation processing program, and wherein a plurality of display panels (4a) each for displaying the individual operation instruction are arranged along the electronic component mounting line.

2. An operation instruction method for use with an electronic component mounting machine that is used in an electronic component mounting line for mounting an electronic component on a substrate so as to produce a mounted board, that is capable of performing a plurality of types of mounting operations by replacement of a work head to be built into a common platform according to a type of mounting operation to be performed by the electronic component mounting machine by a single machine, and that issue operation instructions for letting the electronic component mounting machine perform working operation and computation processing,
   wherein the electronic component mounting machines comprises a substrate conveyance mechanism that conveys the substrate through an interior of the machine and a head transfer mechanism which transfers the replaceably attached work head to perform the work, the substrate conveyance mechanism and the head transfer mechanism making up the common platform;
   a storage section that stores a plurality of types of work programs by means of which a mechanism control part that controls the work head and a work operation mechanism including the head transfer mechanism and the substrate conveyance mechanism so as to carry out working operations performs control processing commensurate with the plurality of types of working operations and a plurality of types of computation processing programs by means of which a computation processing part that performs computation processing required to perform the working operations performs computation processing commensurate with a plurality of types of working operations; an execution control part that controls the mechanism control part and the computation processing part, so as to let a mechanism part and the computation processing part perform control processing and computation processing commensurate with the work type; an operation instruction input unit that has individual input parts for individually inputting an individual operation instruction of a machine operator to the execution control part according to instruction descriptions, wherein the individual operation instruction common to the plurality of types of works is displayed with common display arrangement regardless of the work type on each of the individual input parts and the individual operation instruction includes at least a work start/end instruction meaning start or end of working operation of the electronic component mounting machine; and a work head recognition unit for recognizing a type of a work head attached to the head transfer mechanism; and wherein there is determined a work program corresponding to the work head recognized by the work head recognition unit and a computation processing program, from among the plurality of types of stored work programs and computation processing programs, and the mechanism control part and the computation processing part are caused to perform control processing and computation processing commensurate with an operation instruction, which has been input by the individual input part, according to a determined work program and a determined computation processing program, and wherein a plurality of display panels (4a) each for displaying the individual operation instruction are arranged along the electronic component mounting line.

* * * * *